(12) United States Patent
Lee et al.

(10) Patent No.: US 6,287,910 B2
(45) Date of Patent: Sep. 11, 2001

(54) METHOD FOR FORMING A CAPACITOR USING TANTALUM NITRIDE AS A CAPACITOR DIELECTRIC

(75) Inventors: Kee Jeung Lee, Seoul; Hong Seon Yang, Kyoungki-do, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/741,875

(22) Filed: Dec. 22, 2000

(30) Foreign Application Priority Data

Dec. 23, 1999 (KR) .................................................. 99-61345

(51) Int. Cl.$^7$ ............................................. H01L 21/8242
(52) U.S. Cl. .................... 438/240; 438/253; 438/255; 438/398; 438/482
(58) Field of Search ................................ 438/3, 240, 253, 438/254, 255, 396, 397, 398, 482

(56) References Cited

U.S. PATENT DOCUMENTS 5,352,623 * 10/1994 Kamiyama ........................ 438/240

6,201,276 * 3/2001 Agarwal et al. ..................... 257/315

FOREIGN PATENT DOCUMENTS

02000058878A * 2/2000 (JP) .

* cited by examiner

*Primary Examiner*—Charles Bowers
*Assistant Examiner*—Jack Chen
(74) *Attorney, Agent, or Firm*—Pillsbury Winthrop LLP

(57) ABSTRACT

A method for fabricating capacitors for semiconductor devices utilizing a $Ta_3N_5$ dielectric layer is provided by the present invention. This method includes the steps of forming a lower electrode on a semiconductor substrate, depositing an amorphous TaON thin film over the lower electrode, and subjecting the deposited amorphous TaON thin film to a thermal process in an $NH_3$ atmosphere, thereby forming a $Ta_3N_5$ dielectric film, and forming an upper electrode on the $Ta_3N_5$ dielectric film. The resulting $Ta_3N_5$ dielectric film provides a dielectric constant significantly greater than those that can be achieved with conventional dielectric films. Accordingly, the $Ta_3N_5$ dielectric film of the present invention can be used to manufacture capacitors for the next generation semiconductor memory devices of 256M grade or higher.

20 Claims, 5 Drawing Sheets

Composition of $Ta_3N_5$ thin film after RTP annealing under $NH_3$ atmosphere

Composition of $Ta_3N_5$ thin film after RTP annealing under $NH_3$ atmosphere

METHOD FOR FORMING A CAPACITOR USING TANTALUM NITRIDE AS A CAPACITOR DIELECTRIC

BACKGROUND OF THE INVENTION

1. Field of the Invention

The present invention relates to a method for fabricating capacitors for semiconductor devices and, more particularly, to a method for fabricating capacitors for semiconductor devices that provide the increased levels of capacitance necessary for more highly integrated devices while maintaining suitable electrical characteristics.

2. Description of the Related Art

In order to obtain semiconductor devices having higher degrees of integration, active research and development efforts continue to be directed toward both reducing cell area and reducing the device operating voltage. Although high levels of device integration greatly reduce the wafer area available for capacitor formation, the charge capacity preferred for an operation of a memory device remains on the order of 25 fF per cell despite the reduction in cell area. This level of charge is useful in preventing the generation of soft errors and avoiding reductions in the refresh time.

Conventional DRAM capacitors commonly use a dielectric film having a stacked nitride/oxide (NO) structure, a three-dimensional lower electrode structure, such as a cylinder, and/or reduced dielectric thickness to obtain sufficient capacitance values. Despite these measures, however, the conventional NO dielectric (with a dielectric constant of approximately 4–5) is generally unable to provide sufficient capacitance within the cell dimensions required for highly integrated (256M and above) semiconductor devices.

Other efforts to increase the capacitance values have sought to replace the conventional oxide or NO dielectric layers with a more complex ONO (Oxide-Nitride-Oxide) or a metal based dielectric layer such as $Ta_2O_5$ or BST ($BaSrTiO_3$) that provides a significantly increased dielectric constant (approximately 20 to 25) to obtain the increased capacitance values necessary for production of advanced semiconductor devices.

In a nominal $Ta_2O_5$ thin film, however, substitutional Ta atoms inevitably exist as a result of composition ratio variations between the Ta and O atoms within the film. The nominal stoichiometry, although convenient, does not reflect the inherent chemical instability of the $Ta_2O_5$ film. In other words, substitutive Ta atoms in the form of oxygen vacancies are always present in the $Ta_2O_5$ thin film due to the variable and unstable stoichiometry of the Ta2O5 material. Furthermore, although the number of oxygen vacancies may be varied somewhat depending on the actual composition and bonding degrees of the incorporated elements, the oxygen vacancies cannot be completely eliminated from the dielectric thin film.

In addition, during the formation of the $Ta_2O_5$ thin film, the organic portions from the $Ta(OC_2H_5)_5$, a precursor compound used in forming the $Ta_2O_5$ film, can react with $O_2$ or $N_2O$ gas during the LPCVD process to form various impurities including carbon (C), carbon compounds (such as $CH_4$ and $C_2H_4$), and water vapor ($H_2O$), that are, in turn, incorporated into the $Ta_2O_5$ thin film. As a result of these impurities, as well as other ions, free radicals and oxygen vacancies that may be present in the $Ta_2O_5$ film, the resulting capacitors tend to exhibit increased leakage current and degraded dielectric characteristics.

Although the impurities present in the $Ta_2O_5$ thin film may be removed or significantly reduced by repeatedly applying a low-temperature treatment (for example, a plasma $N_2O$ or $UV-O_3$ treatment), these remedial steps add to the overall process complexity and can be difficult to control. Furthermore, even these low-temperature treatments may be sufficient to cause unwanted oxidation at the interface between the $Ta_2O_5$ film and the lower electrode, lowering the effective dielectric constant.

SUMMARY OF THE INVENTION

The method according to the present invention has been developed to overcome the above mentioned problems and limitations experienced with and/or inherent in prior art processes and materials. It is an object of the invention to provide a method for fabricating capacitors for semiconductor devices that exhibit improved electrical characteristics while ensuring sufficient capacitance to support advanced semiconductor devices.

Another object of the invention is to provide a method for fabricating capacitors for semiconductor devices that renders unnecessary certain process steps designed to increase the effective capacitor area and thus ensure a sufficiently high capacitance. By allowing these steps to be eliminated, the present invention simplifies the manufacturing process by reducing the number of processing steps, thereby also reducing both the processing time and the associated manufacturing costs.

In accordance with one aspect, the present invention provides a method for fabricating a capacitor for a semiconductor device, comprising the steps of: forming a lower electrode on an understructure of a semiconductor substrate; depositing an amorphous TaON thin film over the lower electrode; subjecting the amorphous TaON thin film to a thermal process in an $NH_3$ atmosphere to form a $Ta_3N_5$ dielectric film; and forming an upper electrode on the $Ta_3N_5$ dielectric film.

In another embodiment, the present invention provides a method for fabricating a capacitor for a semiconductor device, comprising the steps of: forming a lower electrode on an understructure of a semiconductor substrate; forming an amorphous TaON thin film over the lower electrode; subjecting the amorphous TaON thin film to a thermal process in an $NH_3$ atmosphere at a temperature of 600 to 950° C. to form a $Ta_3N_5$ dielectric film; annealing the $Ta_3N_5$ dielectric film; and forming an upper electrode on the $Ta_3N_5$ dielectric film.

In another embodiment, the present invention provides a method for fabricating a capacitor for a semiconductor device, comprising the steps of: forming a lower electrode on an understructure of a semiconductor substrate; nitriding the lower electrode in an $NH_3$ atmosphere; forming an amorphous TaON thin film over the lower electrode; subjecting the amorphous TaON thin film to a thermal process in an $NH_3$ atmosphere at a temperature of 600 to 950° C. to form a $Ta_3N_5$ dielectric film; annealing the $Ta_3N_5$ dielectric film; and forming an upper electrode on the $Ta_3N_5$ dielectric film.

The above objects, and other features and advantages of the present invention will become more apparent in light of the following detailed description and the accompanying figures.

DESCRIPTION OF THE PREFERRED EMBODIMENTS

A method for fabricating capacitors for semiconductor devices in accordance with the present invention is described in detail below with reference to the accompanying figures.

Figure 1:
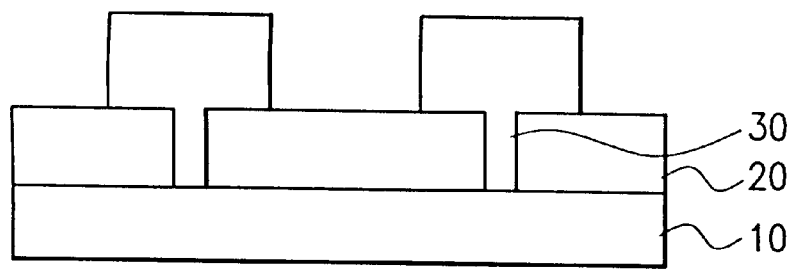
FIGS. 1 to 4 provide a series of sequential cross-sectional views illustrating various layers, features, and processing steps in a method for fabricating capacitors for semiconductor devices in accordance with the present invention.

In fabricating capacitors in accordance with the method of the present invention, a semiconductor substrate 10, which may be a silicon substrate, is first prepared, as shown FIG. 1. Although such structures are not illustrated in the Figures, it will be appreciated that the semiconductor substrate 10 will typically have already undergone extensive processing to create various features and elements that are required to produce a fully functional semiconductor device. These structures will typically include active and isolation regions, doped regions including wells, channel-stops, sources and drains, insulating layers, such as oxides, nitrides, or oxynitrides, and conductive layers such as polysilicon or silicide.

An insulating layer, typically a material comprising undoped silicate glass (USG), borophosphosilicate glass (BPSG), or SiON is then formed or deposited on the silicon substrate 10. This insulating layer then planarized, typically using a chemical mechanical polishing (CMP) process, to form an interlayer insulating film 20.

Utilizing conventional photolithography and dry etch processes, a series of contact openings are then formed at predetermined locations in the interlayer insulating film 20. These contact openings will provide a contact path between predetermined areas of the semiconductor substrate 10 and the lower electrode of the capacitor.

A layer of conductive material, such as doped polysilicon or doped amorphous silicon is then formed on the interlayer insulating film 20. Again using conventional photolithography and etch processes, the layer of conductive material is selectively patterned and etched to form lower electrodes 30. Each of the lower electrodes 30 will incorporate at least one contact opening for providing electrical contact between the electrode and the semiconductor substrate.

In accordance with the present invention, it is expected that lower electrodes 30 having a simple planar stack structure will be sufficient to provide sufficient capacitance. Of course, the present invention is equally suitable for use with more complex lower electrode 30 structures such as stepped, cylinder, fin or other three-dimensional configuration.

Figure 2:
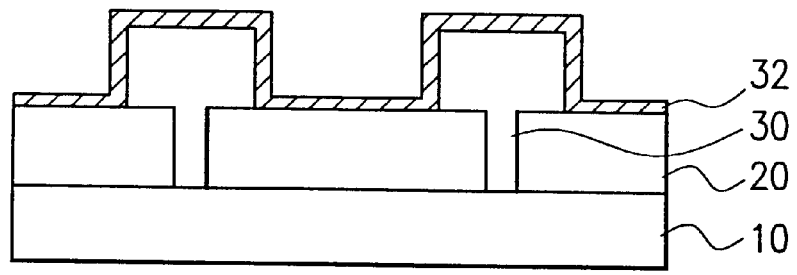
Figure 3:
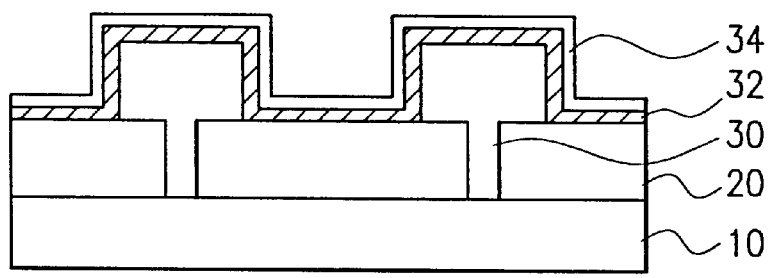

An amorphous TaON film 32 is then deposited on the exposed surfaces of the lower electrode 30 and the interlayer insulating layer 20 as shown in FIG. 2. This amorphous TaON film is then annealed to form a $Ta_3N_5$ dielectric film 32. Preferably, the amorphous TaON film is formed in a low-pressure chemical vapor deposition (LPCVD) chamber by reacting a vaporized tantalum-containing organic metal compound such as $Ta(OC_2H_5)_5$ or $Ta(N(CH_3)_2)_5$ with $NH_3$ at a temperature of 300 to 600° C. Typically a highly pure (at least 99.999%) solution of $Ta(OC_2H_5)_5$ or $Ta(N(CH_3)_2)_5$ is fed, at a rate of less than 300 mg/minute, into an evaporator or evaporator tube that is maintained at a temperature of at least 150° C. The feed rate of the solution is preferably controlled using a mass flow controller (MFC). During this process, the entire vapor path between the evaporator and the LPCVD chamber, including any orifice or nozzle and all supply tubes that provide a flow path for the Ta compound vapor, are maintained at a temperature of between 150 and 200° C. in order to prevent any condensation of the Ta compound vapor.

The desired amount of the Ta compound vapor is then fed into the LPCVD chamber along with a desired amount of the reaction gas (ranging from 10 sccm to 500 sccm for $NH_3$). The gases then react in the LPCVD chamber at a pressure of 100 torr or less to form the desired amorphous TaON thin film.

Preferably, the amorphous TaON thin film is then annealed under an $NH_3$ atmosphere at a temperature of between 650 and 950° C. so that the amorphous TaON thin film is converted to $Ta_3N_5$ film having a crystalline structure. This annealing process may be conducted in a rapid thermal process (RTP) apparatus or in a low-pressure or atmospheric pressure furnace.

The $Ta_3N_5$ film 32 may then be subjected to an additional annealing process to form a homogeneous oxide film 34 over the exposed surface of the $Ta_3N_5$ dielectric film 32. This additional annealing process may utilize plasma or rapid thermal processes under an $O_2$ or $N_2O$ atmosphere. Alternatively, the additional annealing process may be conducted in an $O_3$ atmosphere, preferably under UV radiation as well. This additional annealing process makes it possible to control the nitrogen content of the $Ta_3N_5$ dielectric film 32, thereby allowing improvements in the capacitor characteristics associated with leakage current or breakdown voltage.

Figure 4:
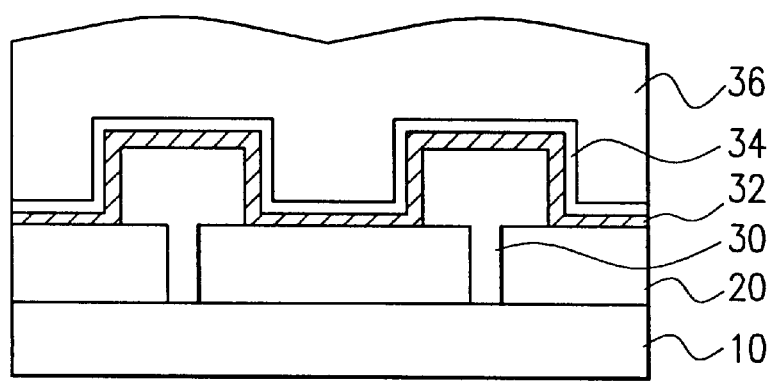

A layer of conductive material, such as doped polysilicon, is then deposited over the $Ta_3N_5$ dielectric film 32, as shown in FIG. 4. The layer of conductive material is then patterned and etched according to conventional photolithographic and etch processes to form upper electrodes 36 and complete the fabrication of a capacitor having a $Ta_3N_5$ dielectric film according to a first embodiment of the present invention.

Figure 5:
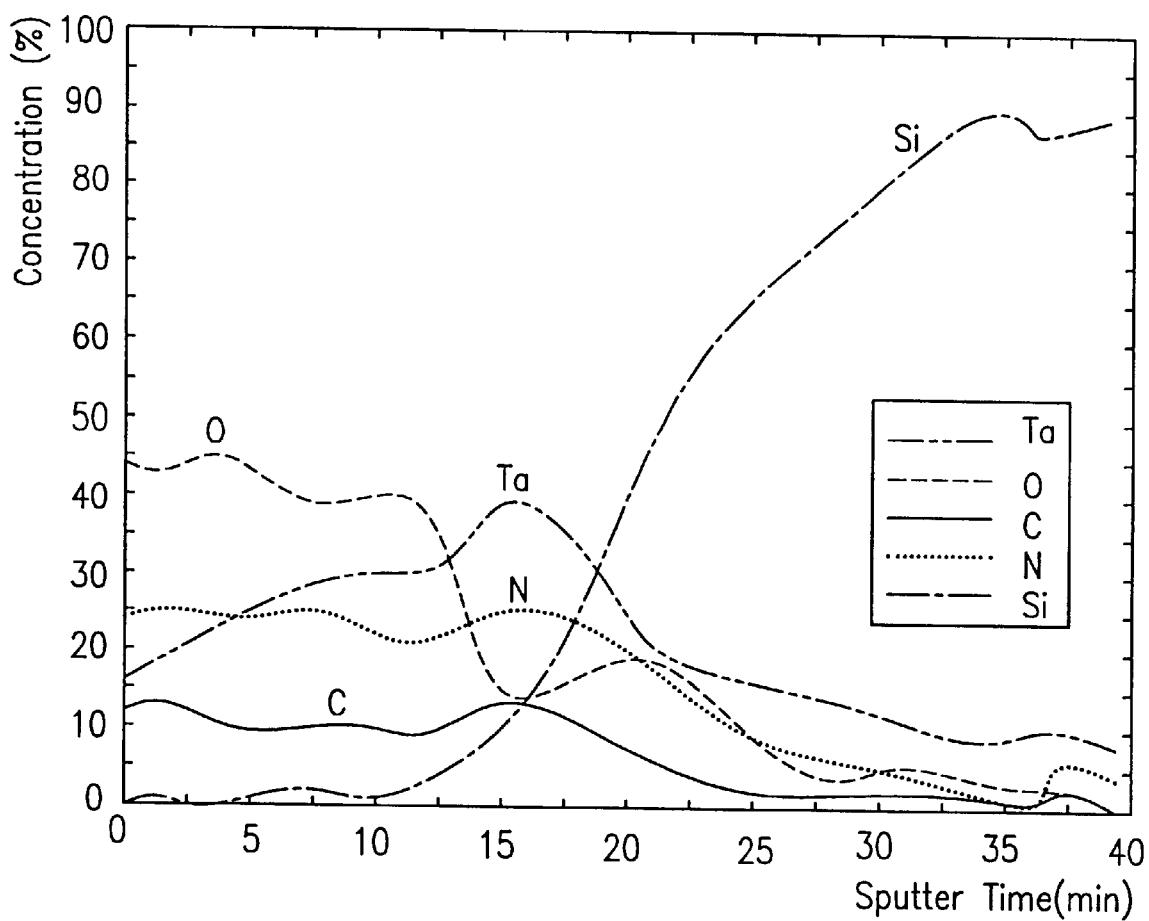
FIGS. 5 and 6 are graphs illustrating the relative concentrations of the constituent atoms present in the initial amorphous TaON dielectric film, FIG. 5, and in the $Ta_3N_5$ dielectric film formed by annealing the TaON film under an NH3 atmosphere in accordance with the present invention, FIG. 6, respectively.
Figure 6:
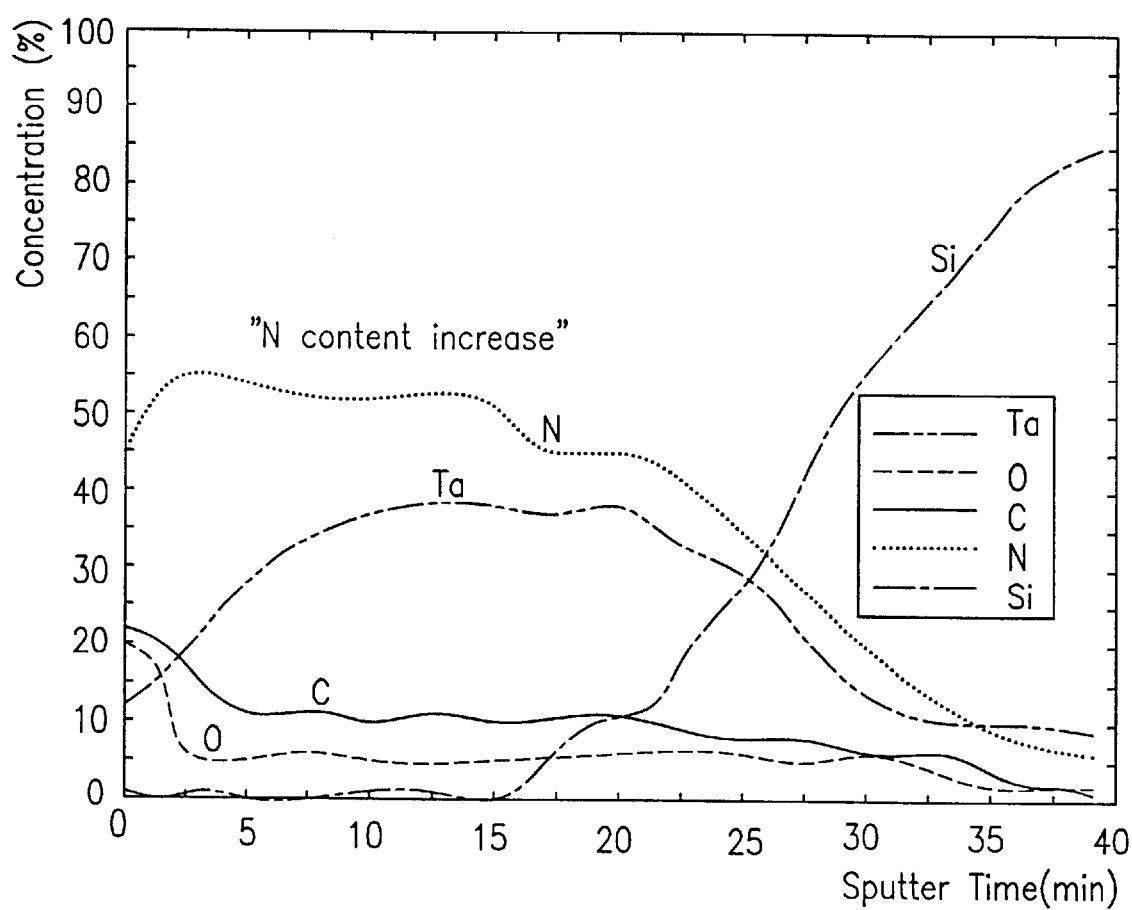

The alteration of the chemical composition of the dielectric layer according to the present invention is illustrated in FIGS. 5 and 6. FIG. 5 illustrates the relative concentrations of atoms in the amorphous TaON as deposited on the lower electrode. FIG. 6, however, illustrates the relative concentrations of atoms in the $Ta_3N_5$ dielectric film formed by annealing the TaON layer under an $NH_3$ atmosphere according to the present invention. Comparing the relative concentrations of the component atoms shown in FIGS. 5 and 6 demonstrates the significant reduction in the oxygen level and the corresponding increase in the nitrogen level achieved with the $NH_3$ annealing process of the present invention. Thus, it is possible to obtain a $Ta_3N_5$ film having a dielectric constant of at least about 100. Accordingly, capacitors having a greatly increased capacitance can be obtained in the same or reduced cell areas.

Prior to the deposition of the TaON layer, it is preferable to remove any natural oxide and/or other contaminants and particles that may be present on the surface of the lower electrodes 30. This cleaning may be accomplished utilizing an in situ dry cleaning process using HF vapor or an ex-situ wet cleaning process using a HF solution. Furthermore, the surfaces of lower electrodes 13 may be cleaned using a $NH_4OH$ solution, $H_2SO_4$ solution, or a combination thereof before and/or after the HF cleaning process.

Further, the surface of the lower electrodes 30 may be nitrided in order to prevent the formation of a natural oxide film on the lower electrode during the deposition of the TaON layer. Preferably, this nitriding process is conducted using a plasma treatment in an $NH_3$ atmosphere for 1 to 5 minutes. The thin nitride layer formed on the surface of the lower electrode 30 during this process prevents oxidation of the lower electrode, thereby improving the dielectric properties of the resulting capacitors.

Figure 7:
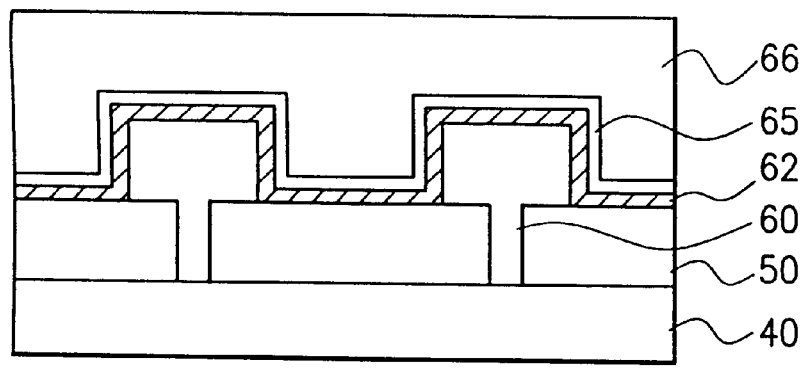
FIG. 7 is a cross-sectional view illustrating a capacitor structure having a $Ta_3N_5$ dielectric film fabricated in accordance with another embodiment of the present invention.

FIG. 7 is a cross-sectional view illustrating a capacitor structure having a $Ta_3N_5$ dielectric film fabricated in accordance with another embodiment of the present invention. In this additional embodiment, an interlayer insulating film 50, lower electrodes 60, and a $Ta_3N_5$ dielectric film 62 are sequentially formed on a silicon substrate 40 in much the same manner utilized in the first embodiment and as illustrated in FIGS. 1 and 2. A metal layer 65, that will serve as the primary conductive layer, and a doped polysilicon layer 36, that will serve as a buffer layer, are formed sequentially over the $Ta_3N_5$ dielectric film 62. The metal layer 65 and the polysilicon layer are then patterned and etched to form the upper electrodes for capacitors having a metal-insulator-silicon (MIS) structure.

Alternatively, both the upper and lower electrodes may be formed of a metal-based material selected from the group consisting of TiN, Ti, TaN, W, WN, WSi, Ru, $RuO_2$, Ir, and Pt, rather than doped polysilicon. When a metal-based material is used for the upper and lower electrodes, it is possible to form $Ta_3N_5$ capacitors having a metal-insulator-metal (MIM) structure.

Figure 8:
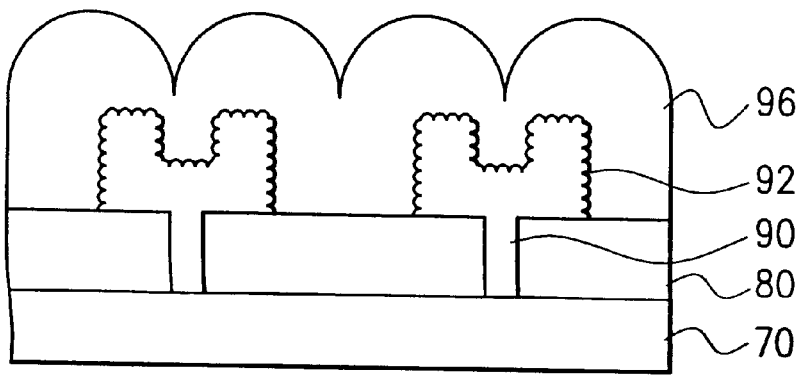
FIG. 8 is a cross-sectional view illustrating a capacitor structure having a $Ta_3N_5$ dielectric film fabricated in accordance with another embodiment of the present invention.

FIG. 8 provides a cross-sectional view illustrating a capacitor structure having a $Ta_3N_5$ dielectric film fabricated in accordance with another embodiment of the present invention. In this particular embodiment, an interlayer insulating film 80 and lower electrodes 90 are sequentially formed on a silicon substrate 70 in a fashion similar to that described in the first embodiment. In this case, however, each of the lower electrodes 90 are formed with a hemispherical grain (HSG) structure at their surface. A $Ta_3N_5$ dielectric film 92 is then formed over the lower electrodes 90 in a fashion substantially similar to that described with regard to the first embodiment. Upper electrodes 96 are then formed on the $Ta_3N_5$ dielectric film 92 to complete the basic capacitor formation.

As apparent from the above description of the various embodiments, the method for fabricating capacitors for semiconductor devices according to the present invention may be altered and/or adjusted to provide various effects. In each of the embodiments, however, an amorphous TaON film is annealed in an $NH_3$ atmosphere to reduce the oxygen level and to increase the nitrogen level in the film to produce a new dielectric film having a nominal stoichiometry of approximately $Ta_3N_5$. The $Ta_3N_5$ dielectric film prepared according to the present invention can routinely provide a layer having a dielectric constant of about 100 or more. Because the $Ta_3N_5$ dielectric film of the present invention provides a dielectric constant at least three to four times greater than a more conventional $Ta_2O_5$ dielectric and at least 20 times greater than the older NO and ONO dielectric structures, it readily supports the capacitance levels and sizing demands of advanced semiconductor memory devices of 256M grade and higher.

By virtue of the greatly increased dielectric constant provided by the $Ta_3N_5$ dielectric film, it is possible to form a dielectric layer equivalent to an oxide film thickness ($T_{ox}$) of about 25 Å or less while simultaneously maintaining sufficient dielectric strength.

Even in designs in which the lower electrode has a simple planar stack structure, the dramatic increase in the dielectric constant of the $Ta_3N_5$ dielectric film makes such designs more suitable for use in more highly-integrated semiconductor devices.

Furthermore, the improved dielectric constant provided by the $Ta_3N_5$ dielectric film according to the present invention makes it possible to eliminate any additional process steps that had been used to increase the surface area, and thus increase the capacitance, of the lower electrodes. Eliminating these steps reduces the overall process time and cost. Further, the simplified structures, and the resulting simplification of the overall device topography, may result in improvements in subsequent photolithographic and etch processes.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device, comprising the steps of:

forming a lower electrode on a semiconductor substrate;

forming an amorphous TaON thin film over the lower electrode, annealing the amorphous TaON thin film in an $NH_3$ atmosphere to produce a $Ta_3N_5$ dielectric film; and forming an upper electrode on the $Ta_3N_5$ dielectric film.

2. The method according to claim 1, wherein the step of forming the lower electrode further comprises forming at least a first lower conductive layer, the first lower conductive layer comprising doped polysilicon or metal and, optionally, forming a second lower conductive layer, the second lower conductive layer comprising doped polysilicon or metal; and further wherein the step of forming the upper electrode further comprises forming at least a first upper conductive layer, the first upper conductive layer comprising doped polysilicon or metal and, optionally, forming a second upper conductive layer, the second upper conductive layer comprising doped polysilicon or metal.

3. The method according to claim 2, wherein the metal is selected from the group consisting of TiN, Ti, TaN, W, WN, WSi, Ru, $RuO_2$, Ir, and Pt.

4. The method according to claim 1, wherein the step of forming the lower electrode further comprises forming a layer of doped polysilicon, the layer of doped polysilicon having a surface characterized by a hemispherical grain structure.

5. The method according to claim 1, wherein the step of forming the lower electrode further comprises forming a layer of doped polysilicon and nitriding the layer of doped polysilicon in an $NH_3$ atmosphere for 1 to 5 minutes.

6. The method according to claim 1, the step of forming an amorphous TaON thin film over the lower electrode further comprising etching the surface of the lower electrode to remove a native oxide, the etching step comprising a dry cleaning process using HF vapor or a wet cleaning process using an HF solution, and then depositing a TaON thin film on the lower electrode.

7. The method according to claim 1, wherein the step of annealing the amorphous TaON thin film is carried out at a temperature of between 600 and 950° C.

8. The method according to claim 1, wherein the step of forming the amorphous TaON thin film further comprises evaporating a tantalum compound at a temperature between 150 and 200° C. to produce a tantalum compound vapor and injecting the resulting tantalum compound vapor into a LPCVD chamber.

9. The method according to claim 8, wherein the step of forming the amorphous TaON thin film further comprises controlling the injecting of the tantalum compound vapor with a mass flow controller, injecting $NH_3$ into the LPCVD chamber, and maintaining the LPCVD chamber at a temperature between 300 and 600° C. and at a pressure below 100 Torr.

10. The method according to claim 1, further comprising the step of treating the $Ta_3N_5$ dielectric film to control the final nitrogen content in the Ta3N5 dielectric film.

11. The method according to claim 10, wherein the step of treating the Ta3N5 dielectric film comprises subjecting the $Ta_3N_5$ dielectric film to at least a plasma process under an $O_2$ or $N_2O$ atmosphere, a rapid thermal process under an $O_2$ or $N_2O$ atmosphere, or an annealing process under an $O_3$ atmosphere with optional UV radiation.

12. The method according to claim 11, wherein the step of treating the $Ta_3N_5$ dielectric film further comprises the step of forming an oxide film over the $Ta_3N_5$ dielectric film.

13. The method according to claim 1, wherein the step of annealing the amorphous TaON thin film further comprises using a rapid thermal process or a electric furnace, the furnace being operated at or below atmospheric pressure.

14. The method according to claim 13, further comprising the step of forming an oxide film over the $Ta_3N_5$ dielectric film.

15. A method for fabricating a capacitor of a semiconductor device, comprising the steps of:

forming a lower electrode on a semiconductor substrate;

forming an amorphous TaON thin film over the lower electrode, and subjecting the amorphous TaON thin film to a thermal process under an $NH_3$ atmosphere at a temperature between 600 and 950° C., to form a $Ta_3N_5$ dielectric film;

annealing the $Ta_3N_5$ dielectric film; and forming an upper electrode on the $Ta_3N_5$ dielectric film.

16. The method according to claim 15, wherein the annealing step further comprises a plasma process under an $O_2$ or $N_2O$ atmosphere, a rapid thermal process under an $O_2$ or $N_2O$ atmosphere, or an annealing process under an $O_3$ atmosphere with optional UV radiation.

17. The method according to claim 15, wherein the step of forming lower forming the lower electrode further comprises forming at least a first lower conductive layer, the first lower conductive layer comprising doped polysilicon or metal and, optionally, forming a second lower conductive layer, the second lower conductive layer comprising doped polysilicon or metal;

and further wherein the step of forming the upper electrode further comprises forming at least a first upper conductive layer, the first upper conductive layer comprising doped polysilicon or metal and, optionally, forming a second upper conductive layer, the second upper conductive layer comprising doped polysilicon or metal;

and further wherein the metal is selected from a group consisting of TiN, Ti, TaN, W, WN, WSi, Ru, $RuO_2$, Ir, and Pt.

18. The method according to claim 15, wherein the step of forming the lower electrode further comprises forming a layer of doped polysilicon, the layer of doped polysilicon having a surface characterized by a hemispherical grain structure.

19. The method according to claim 15, wherein the step of forming the lower electrode further comprises forming a layer of doped polysilicon and nitriding the layer of doped polysilicon in an $NH_3$ atmosphere for 1 to 5 minutes.

20. A method for fabricating a capacitor of a semiconductor device, comprising the steps of:

forming a lower electrode on a semiconductor substrate;

nitriding the lower electrode in an $NH_3$ atmosphere;

forming an amorphous TaON thin film over the lower electrode, subjecting the amorphous TaON thin film to a thermal process in an $NH_3$ atmosphere at a temperature between 600 and 950° C., to form a $Ta_3N_5$ dielectric film;

annealing the $Ta_3N_5$ dielectric film; and forming an upper electrode on the $Ta_3N_5$ dielectric film.

* * * * *